United States Patent
Liang et al.

(10) Patent No.: US 6,461,895 B1
(45) Date of Patent: *Oct. 8, 2002

(54) PROCESS FOR MAKING ACTIVE INTERPOSER FOR HIGH PERFORMANCE PACKAGING APPLICATIONS

(75) Inventors: Chunlin Liang, San Jose; Larry E. Mosley, Sunnyvale; Xiao Chun Mu, Saratoga, all of CA (US)

(73) Assignee: Intel Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/606,871

(22) Filed: Jun. 29, 2000

Related U.S. Application Data (63) Continuation-in-part of application No. 09/538,327, filed on Mar. 29, 2000, now Pat. No. 6,365,962, which is a continuation-in-part of application No. 09/225,418, filed on Jan. 5, 1999.

(51) Int. Cl.$^7$ .............................................. H01L 21/44
(52) U.S. Cl. ...................................... 438/107; 438/118
(58) Field of Search ................. 439/620; 327/564–566; 257/723, 668, 700; 438/455, 106, 107, 108, 109, 127, 118, 456, 459

(56) References Cited

U.S. PATENT DOCUMENTS

| | | | | |
|---|---|---|---|---|
| 5,583,378 A | * | 12/1996 | Marrs et al. | 257/710 |
| 5,642,262 A | * | 6/1997 | Terrill et al. | 361/783 |
| 5,674,785 A | * | 10/1997 | Akram et al. | 438/15 |
| 5,981,314 A | * | 11/1999 | Glenn et al. | 438/127 |
| 6,137,164 A | * | 10/2000 | Yew et al. | 257/686 |
| 6,188,127 B1 | * | 2/2001 | Senba et al. | 257/686 |
| 6,274,929 B1 | * | 8/2001 | Leong et al. | 257/724 |

OTHER PUBLICATIONS

Sergent, JE. and Harper, C.A.; Hybrid Microelectronics Handbook, Second Edition, McGraw–Hill, Inc. 1995, pp. 1–12–1–15.*

* cited by examiner

Primary Examiner—John F. Niebling
Assistant Examiner—Christopher Lattin
(74) Attorney, Agent, or Firm—Blakley, Sokoloff, Taylor & Zafman LLP (57) ABSTRACT

An integrated circuit (IC) package process is provided that includes forming a first via hole in a first substrate. Patterning signal lines on a first surface and a second surface of the first substrate. Attaching a second substrate to the first surface of the first substrate. Electronically connecting a portion of the signal lines of the first substrate and the second substrate. Attaching an electrical element to the first surface of the first substrate. Forming a via hole in a third substrate. Introducing conductive material over a first surface and a second surface of the third substrate. Forming a second circuit pattern on the first surface and the second surface of the third substrate. Additionally, attaching the third substrate to the first substrate with a second layer of adhesive. In an alternative embodiment, a process includes forming a via hole in a first substrate. Introducing conductive material over a first surface and a second of the first substrate, wherein the introducing conductive material over the first surface and the second surface of the first substrate fills the via hole to form a via and a through hole. Forming a first circuit pattern on the first surface and the second surface of the first substrate. Forming solder pads on the first circuit pattern. Attaching a second substrate to the first substrate. Attaching an electrical element to the first substrate. Forming a via hole in a second substrate. Introducing conductive material over a first surface and a second of the second substrate. Forming a second circuit pattern on the first surface and the second surface of the second substrate, and attaching the first substrate to the second substrate.

23 Claims, 10 Drawing Sheets

PROCESS FOR MAKING ACTIVE INTERPOSER FOR HIGH PERFORMANCE PACKAGING APPLICATIONS

This application is a continuation-in-part of U.S. patent application Ser. No. 09/225,418, filed Jan. 5, 1999 and U.S. patent application Ser. No. 09/538,327, filed Mar. 29, 2000 now U.S. Pat. No. 6,365,962.

BACKGROUND OF THE INVENTION

1. Field of the Invention

The invention relates to a process for an integrated circuit package that contains a flexible circuit board.

2. Background of the Information

Integrated circuits (IC's) are typically assembled into a package that is mounted to a printed circuit board. The printed circuit board may be, for example, the motherboard of a computer. The IC may be mounted to a substrate or interposer and encapsulated with a plastic or epoxy material. A process known to those skilled in the art as flip-chip technology may be used to attach an IC to a substrate with the IC's I/O (input/output) side facing the substrate. One method that may be. used to attach the flip-chip to the substrate is known as C4 (controlled-collapse chip connection) attachment. With C4, solder bumps are placed on metal terminals on the chip and a matching area of solder terminals on the substrate. The chip is then aligned to the substrate, and all solder connections are made simultaneously by reflowing the solder. The substrate is typically a printed circuit board (PCB) that has a number of pins, known as pin grid array (PGA), or solder balls, known as a ball grid array (BGA), that can be connected to a motherboard.

A substrate such as a PCB typically contains a number of routing traces, vias and solder pads that electrically connect the integrated circuit to the motherboard. The routing traces and solder pads may be separated by one or more layers of dielectric material.

The substrate/printed circuit board is fabricated before the integrated circuit is mounted to the substrate. The substrate must be thick enough to provide enough structural integrity to support the integrated circuit during the mounting process.

For CMOS (complementary metal oxide semiconductor) logic applications, the integration of an IC chip into a single package is typically accomplished through a multi-chip module using a two-dimensional array. This type of package, however, suffers from longer inter-chip connection length. Some of the problems arising from such a package are high propagation delay, high inductance, and cross-talking noise. In a case where a three-dimensional array integration package is used, chips are stacked on top of each other and the inter-chip interconnection is achieved through edge wire bonding. A problem with this type of package is that the total I/O is limited.

In an array interconnect package, alignment and attachment are typically difficult to accomplish. For de-coupling needs, discrete de-coupling capacitors are typically mounted on the die-side or land-side of the package after die attachment. For die-side capacitors, a larger package is typically required which increases cost. For land-side capacitors, a typical package has a large die-to-capacitor separation and a large current loop, which leads to large inductance and degraded system performance.

Because of the limitation in making high performance and fine pitch wiring on an IC board, however, the power signal wire on the IC board are not dense enough to connect directly to the contact bumps concentrated in a small chip area. A redistribution layer, i.e. interposer layer, needs to be inserted between the chip and the PC board to provide pitch adjustment and connection routing. Such an interposer layer is used only to solve what is called an "escape problem" in flip-chip mounting. Therefore the interposer layer functions only in a passive mode. The only function of the passive interposer, therefore, is to provide more efficient and fast signal/clock routing and power distribution. Presently, organic land grid array substrates or flexible circuitry substrates are used as a passive interposer layer which, provides an interconnect function between the IC chip and the IC board.

DETAILED DESCRIPTION

The invention generally relates to an active interposer and a method of fabricating an active interposer. In one embodiment, a suitable active interposer according to the invention includes a multi-layer structure having contact nodes or points on opposing surfaces and signal lines therethrough. Embodiments of active interposers according to the invention further include structures having additional circuitry such as logic circuitry or electrical elements.

Referring to the figures, exemplary embodiments of the invention will now be described. The exemplary embodiments are provided to illustrate the invention and should not be construed as limiting the scope of the invention.

Figure 1:
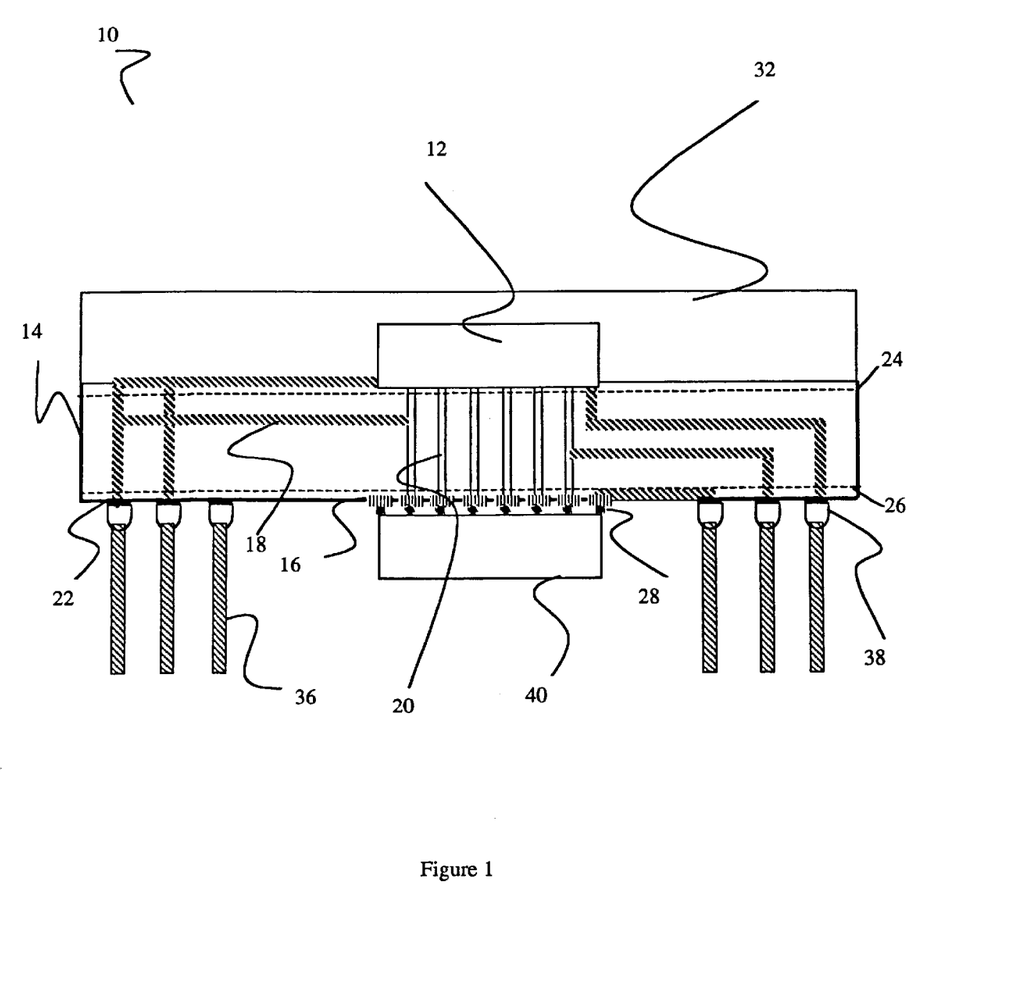
FIG. 1 schematically illustrates a cross-sectional side view of an embodiment of two integrated circuits and a pin grid array (PGA).

FIG. 1 shows an embodiment of integrated circuit (IC) package 10 of the present invention. Package 10 includes two electrical elements, element 12 and 40. The active interposer is formed by interposer layer 14 and electrical element 12 or electrical element 40. In one embodiment of the invention, electrical element 12 is a main system IC chip and electrical element 40 is an auxiliary chip which, with interposer layer 14, forms an active interposer. In another embodiment of the invention, the function of electrical element 12 and electrical element 40 is reversed, i.e., electrical element 12 is an auxiliary chip forming part of the active interposer and electrical element 40 is the main system IC chip that the active interposer supports. It should be mentioned that the auxiliary chip may also be a passive device, such as a de-coupling capacitor. Active interposer 14 includes a plurality of solder pads 16, routing traces 18, vias 20 and land pads 22 that connect top interposer surface 24 with bottom interposer surface 26 and electrical element 40. Top interposer surface 24 is separated from bottom surface 26 by one or more layers of dielectric. The dielectric may be a flexible (FLEX) material such as a polyimide. A polyimide is commonly used to construct flexible circuit boards. Although a flexible polyimide material is described, it is to be understood that other types of material may be employed including a more rigid material. Embedding IC 12 in the FLEX and connecting it through micro-via technology can reduce the connection pitch and allow more input/output (I/O).

Electrical element 40 may be mounted to solder pads 16 of active interposer 14 with solder bumps 28 in a process commonly referred to as controlled collapsed chip connection (C4). The solder bumps 28 may be structurally reinforced with an underfill epoxy material. Integrated circuit 12 is encapsulated with encapsulant 32. Encapsulant 32 is, for example, a plastic or epoxy material. Encapsulant 32 may also be attached to the active interposer 14 in a manner that seals the integrated circuit 12.

Package 10 may include a plurality of electrical contacts that are attached to corresponding land pads of active interposer 14. Each contact may include a pin 36 that is attached to a corresponding land pad 22 with solder ball 38. Pins 36 can be soldered to solder pads or plated through holes of a PCB (not shown), such as the motherboard of a computer. Alternatively, the PCB may be the substrate of an electronic cartridge such as a single edge contact cartridge (SECC) sold by Intel, Corp., the assignee of the invention.

Figure 2:
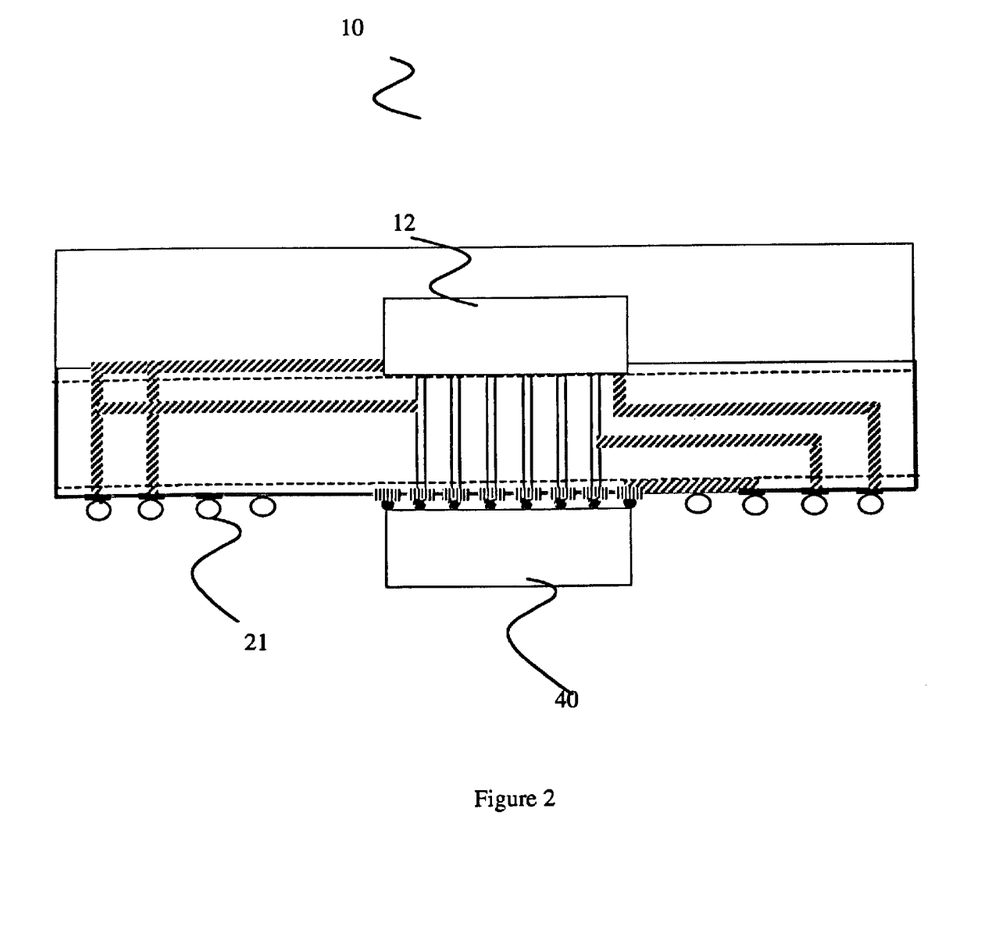
FIG. 2 schematically illustrates an embodiment of two integrated circuits and a solder ball grid array (BGA).

FIG. 2 shows an embodiment of IC package 10 where the contacts to a PCB are solder balls 21 that are reflowed onto the motherboard using known ball grid array (BGA) processes. Alternatively, active interposer 14 may be attached to a PCB with a plurality of solder bumps.

Figure 3:
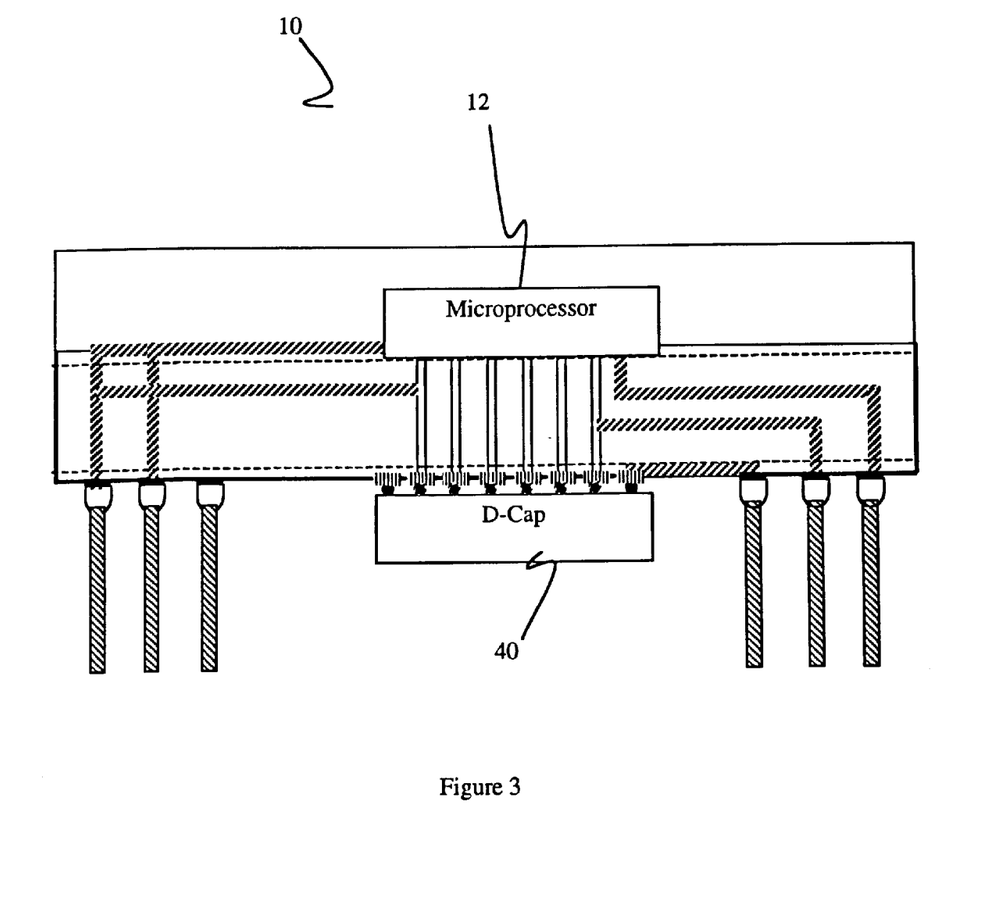
FIG. 3 schematically illustrates an embodiment of a microprocessor and a decoupling capacitor with a pin grid array (PGA).
Figure 4:
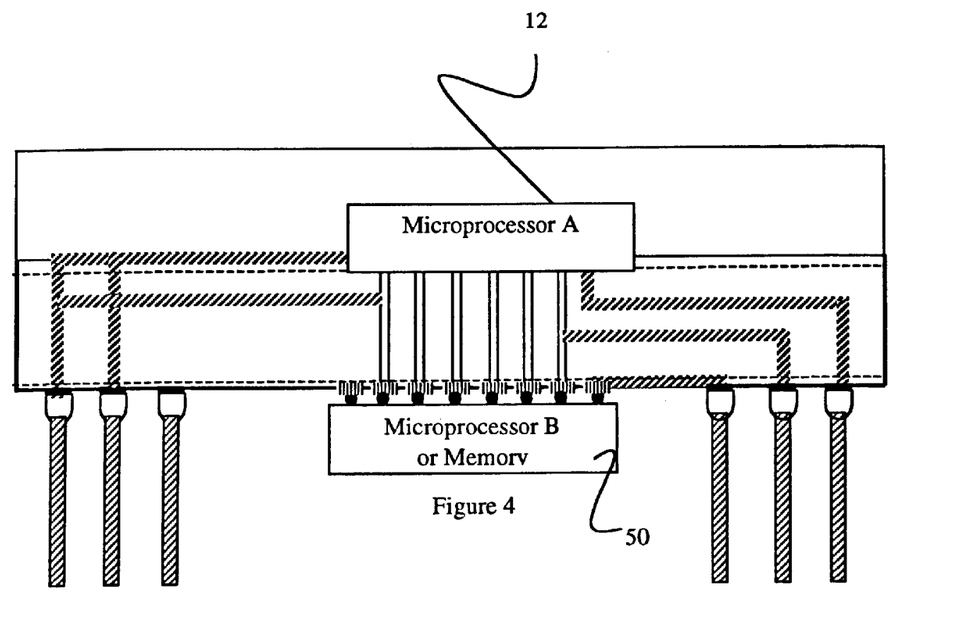
FIG. 4 schematically illustrates an embodiment of a microprocessor A and either a Microprocessor B or a memory with a pin grid array (PGA).
Figure 5:
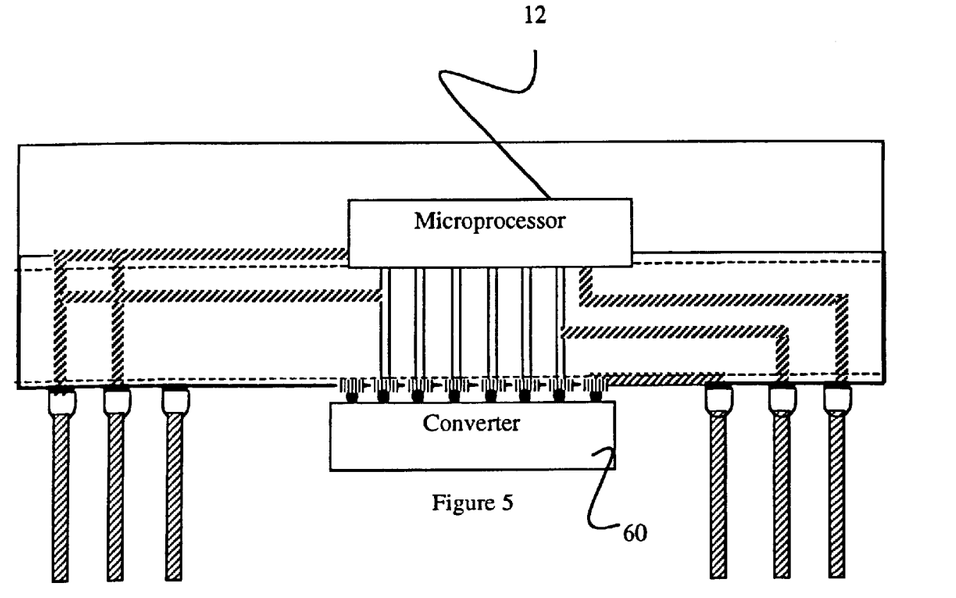
FIG. 5 schematically illustrates an embodiment of a microprocessor and a converter with a pin grid array (PGA).

Referring back to FIG. 1 and FIG. 2, package 10 includes electrical element 40 mounted to second surface 26 of active interposer 14. Element 40 may be mounted to active interposer 14 using C4 flip-chip processes and under-fill protection. In one embodiment in which electrical element 40 is an auxiliary chip, electrical element 40 may be a passive or active device. By way of example, as illustrated in FIG. 3, integrated circuit 12 may be a microprocessor and electrical element 40 may be a de-coupling capacitor. Alternatively, as illustrated in FIG. 4, electrical element 40 may be a memory device or another microprocessor (Microprocessor B) as illustrated by element 50 that is directly connected to microprocessor 12 (Microprocessor A). The direct attachment of both microprocessor 12 and element 50 to the active interposer provides an assembly with a relatively short electrical path between the devices. The short path length reduces the inductance, which can be important for high-speed memory busses between the processor and memory. With a memory device embedded on active interposer layer 14, a memory device can be distributed across the whole chip area and be closely coupled with a processing circuit coupled on top. This allows for the design hierarchy of the memory device as a whole, instead of fragmented units randomly distributed on the IC chip. The advantage becomes more significant with memory and processing circuits, such as embedded DRAM applications. In this case, the active interposer will provide high logic-memory communication bandwidth, save processing and testing costs, and improve yield. This is because memory and logic devices can be fabricated separately with separate optimization technology and then assembled with a memory chip as part of the active interposer. Alternatively, an electrical element 60 may be a power delivery circuit(s) that includes power management, regulator/converter, etc., as illustrated in FIG. 5.

Figure 6:
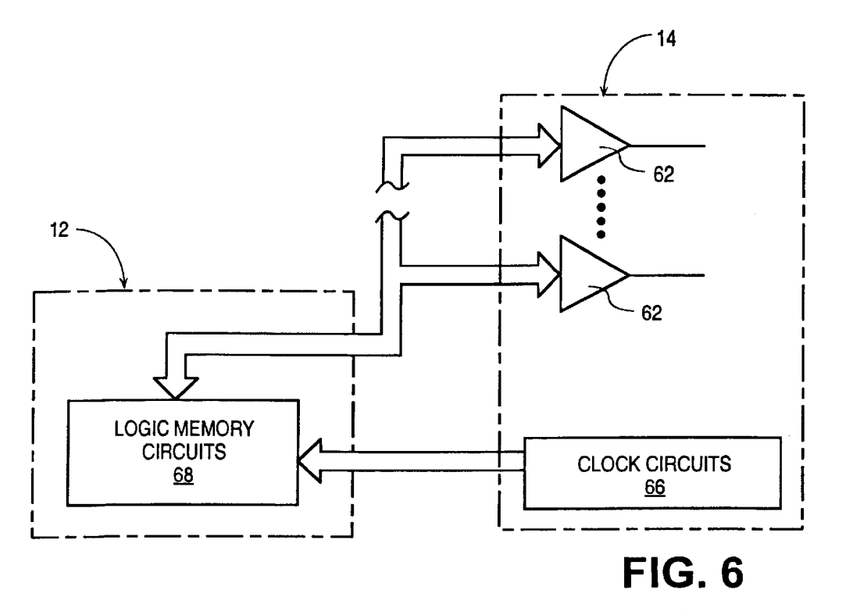
FIG. 6 schematically illustrates an embodiment of a microprocessor comprising logic memory circuits and coupled with clock circuits.

As illustrated in FIG. 6, integrated circuit 12 may be a microprocessor that contains logic and memory circuits 68. Active interposer 14 may contain driver circuits 62 that are connected to the output pads of the microprocessor. Driver circuits 62 can regenerate output signals that are generated by the logic/memory circuit 68 of the microprocessor. Moving driver circuits 62 onto active interposer 14 may reduce the amount of electrical noise on the power rail of the microprocessor created by circuits 62 switching states. Although driver circuits 62 are illustrated and described, it is to be understood that active interposer 14 may contain other circuitry such as buffer circuits (not shown) that are connected to the die pads of the integrated circuit 12.

Active interposer 14 may also have clock circuit(s) 66 which provides a clock signal to logic/memory circuit 68. Moving clock circuit 66 to active interposer 14 allows clock 66 to be created with a fabrication process that is more robust than the process used to form the integrated circuit 12. That is, more layers of clock distribution networks can be implemented on the interposer layer instead of onto a chip. More repeater circuits can be implemented with little die-size penalty. Since a clock distribution network in the interposer layer can adopt more flexible wire pitch, routing and more frequent repeating/regeneration, less delay will occur. Therefore, clock skew will be alleviated and a faster clock network can be implemented. By introducing clock control logic into clock distribution, afforded by the active interposer technique, unique designs, for example, local synchronization, and a gated clock for power management, can also be implemented on the active interposer layer. Active interposer 14 can be constructed with known integrated circuit fabrication processes to construct the transistors, etc. required to create driver circuits 62 and clock circuit 66.

Figure 7:
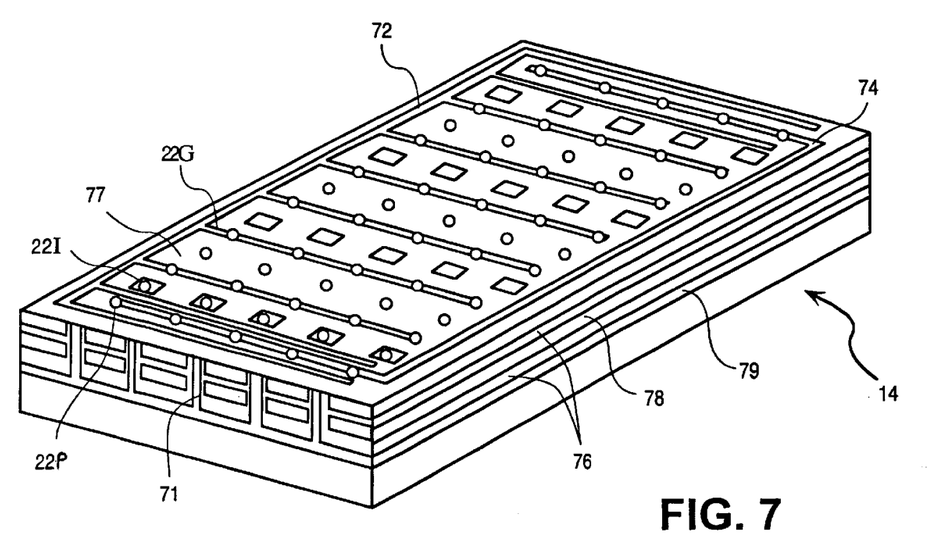
FIG. 7 schematically illustrates a top perspective view of an embodiment of an active interposer.

FIG. 7 shows a top perspective view of an embodiment of active interposer 14. In this embodiment, active interposer 14 has internal power plane 79 and internal ground plane 78. Internal power plane 79 and internal ground plane 78. may be connected to corresponding power and ground planes (not shown) of the printed circuit board by, for example, solder balls 21 illustrated in FIG. 2.

In the embodiment of FIG. 7, active interposer 14 has a number of interconnected power busses 74 and a plurality of interconnected ground busses 72 located on external surface 77. The power and ground pins of driver circuits 62 (see FIG. 6), for example, can be connected to internal power plane 79 and internal, ground plane 78, respectively. The power 74 and ground 72 busses may be connected to the power 79 and ground 78 planes by vias 71.

Power buss 74 and ground buss 72 may be connected to contact pads 22P and 22G that are dedicated to power and ground, respectively. Active interposer 14 may also have I/O contact pads 22I that are connected to corresponding I/O pads of the integrated circuit. I/O contact pads 22I may be coupled to the circuit board by vias 71 in active interposer 14. Power buss 74 and ground buss 72 may be formed in an alternating pattern so that ground busses 72 provide an electrical "shield" to noise created on power busses 74.

Internal ground plane 78 may be separated from internal power plane 79 and power busses 74 by dielectric material 76, which together form filtering capacitors. The capacitors filter noise in the power rail of active interposer 14. Forming the filtering capacitors within active interposer 14 eliminates the need to form the capacitors within integrated circuit 12 and thus reduces the complexity and increases the yield of mass producing integrated circuit 12. Additionally, internal ground plane 78 may be located between internal power plane 79 and integrated circuit 12 to provide a shield for noise generated within the power plane of active interposer 14.

Figure 8:
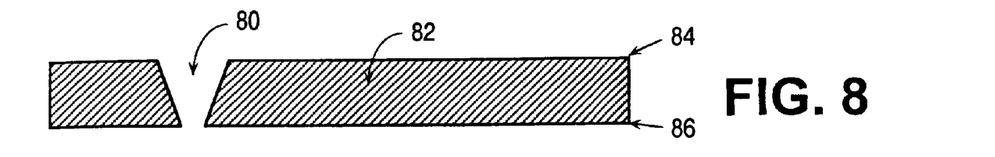
FIG. 8 schematically illustrates a cross-sectional side view of a first substrate with a via hole formed according to an embodiment of the invention.
Figure 9:
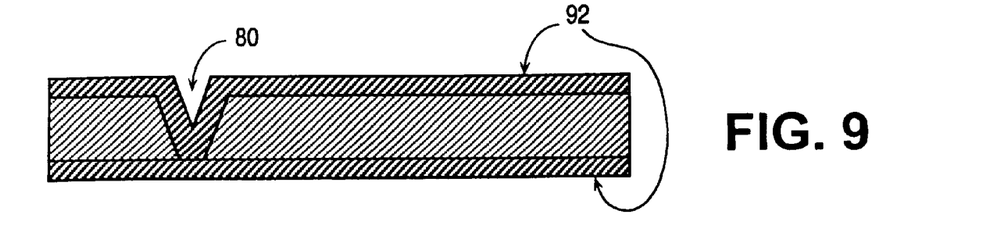
FIG. 9 schematically illustrates the structure of FIG. 8 with metal introduced on the top and bottom surfaces.

FIGS. 8–18 show an embodiment for fabricating an active interposer, such as active interposer 14 described in the preceding embodiments. FIG. 8 shows a cross-section of a portion of a first substrate 82 having formed therein one or more via holes 80. First substrate 82 is, for example, a dielectric material such as polyimide material that is typically used in the fabrication of flexible PCBs (FLEX circuits). Via holes 80 may be formed by mechanical drilling, laser drilling, etching or other processes known in the art. As shown in FIG. 9, metal material 92 such as copper may be introduced onto top 84 and bottom 86 surfaces of the first substrate 82. Suitable introduction methods include deposition or plating. In one embodiment, metal 92 also fills via hole 80 to create a via.

Figure 10:
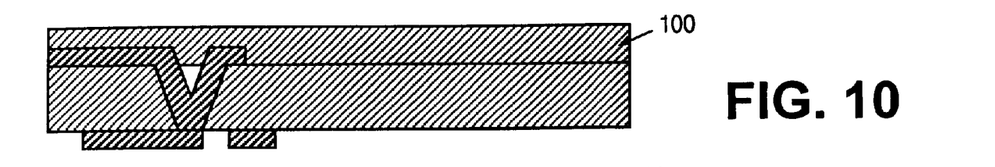
FIG. 10 schematically illustrates the structure of FIG. 9 having a circuit pattern formed thereon.

As illustrated in FIG. 10, a circuit pattern is formed in metal 92 on both top 84 and bottom 86 surfaces of first substrate 82. The circuit pattern may be formed, for example, according to known photolithographic processes. Following patterning, dielectric 100 is introduced to top surface 84 of first substrate 82. Where desired, the dielectric introduction may be followed by a planarization to planarize a surface of the substrate.

Figure 11:
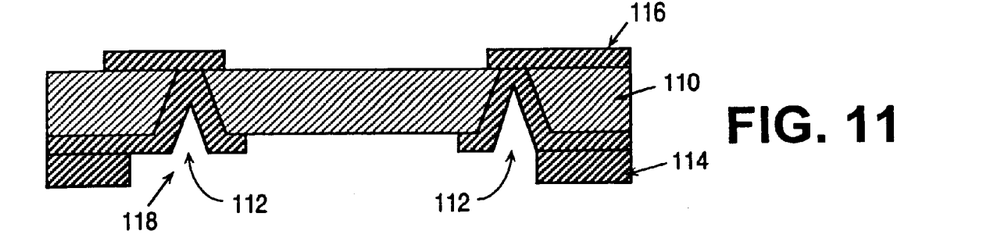
FIG. 11 schematically illustrates a second substrate with similar processes performed as was to the first substrate illustrated in FIGS. 8–10.

As illustrated in FIG. 11, the process shown in FIGS. 8–10 may be repeated for second substrate 110. In one embodiment, second substrate 110 is a dielectric material such as polyimide material that is typically used in the fabrication of FLEX circuits and has a pattern of metal 116, vias 112 and a bottom layer of dielectric 114. In this embodiment, bottom dielectric 114 includes opening 118 to expose vias 112.

Figure 12:
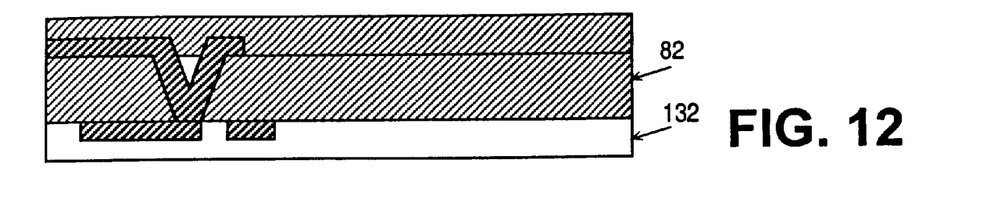
FIG. 12 schematically illustrates an adhesive attached to the first substrate.
Figure 13:
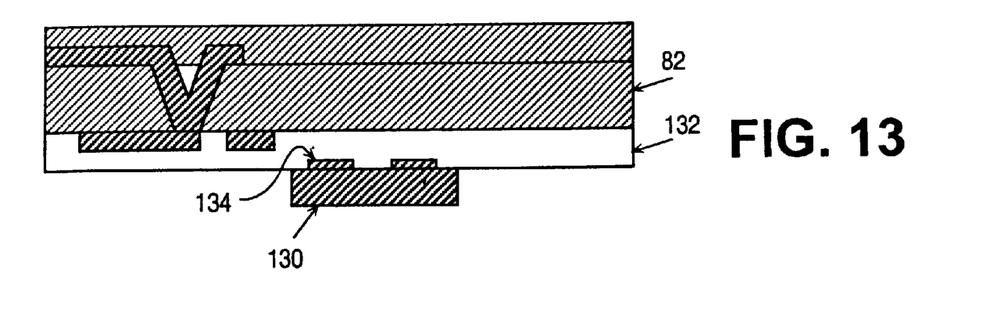
FIG. 13 schematically illustrates an electrical element attached to an adhesive layer.

As illustrated in FIGS. 12–13, electrical element 130 is attached to the first substrate, 82 with, in one embodiment, a layer of adhesive 132. Suitable material for adhesive 132 includes epoxy. In one embodiment of the invention, in which electrical element 130 is the auxiliary chip, electrical element 130 may be either a passive or active device. By way of example, electrical element 130 may be an integrated circuit that provides one or more of the following functions: power delivery network, I/O driver, clock generation/synchronization/repeater network, switching network and control logic for re-configurable and high performance interconnect, and embedded localized/distributed memory. Electrical element 130 may also include or contain active transistors, sensors, de-coupling capacitors, inductors and micro-cooling such as a peltier element. Embedding these functions within the interposer reduces the overall size of the system. Additionally, electrical element 130 is in close physical proximity to electrical element 12 illustrated in FIG. 1. The distance is typically in the order of 25–200 $\mu$m. The close proximity reduces the line lengths and corresponding inductances between IC 12 and the devices within the electrical element 130. Electrical element 130 may include a plurality of contact pads 134.

Figure 14:
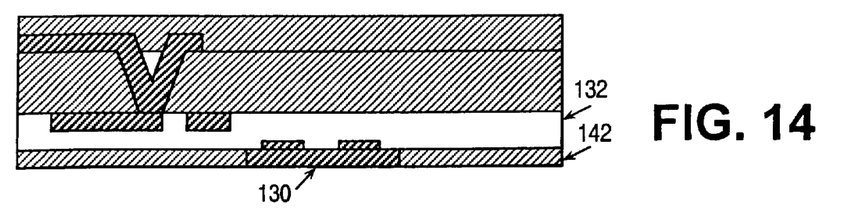
FIG. 14 schematically illustrates a third substrate attached to adhesive to surround an electrical element.

As illustrated in FIG. 14, third dielectric material 142 is introduced to first substrate 82 over adhesive 132 to surround electrical element 130. A portion of electrical element 130 may also be removed, for example through a planarization process, to reduce the thickness of the element 130. Suitable material for third dielectric 142 includes polyimide material that is typically used in the fabrication of FLEX circuits.

Figure 15:
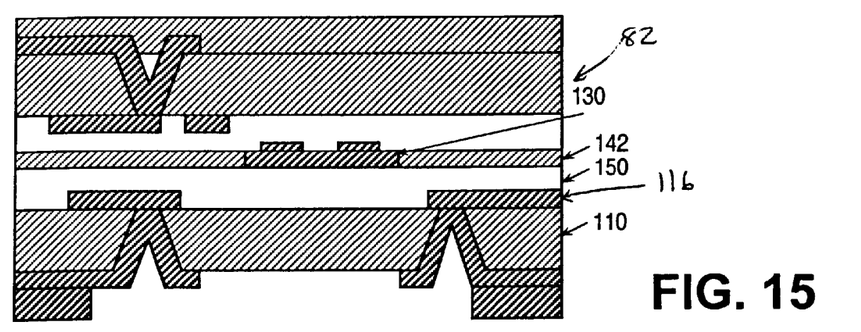
FIG. 15 schematically illustrates a first substrate attached to a second substrate with adhesive.

Second substrate 110 is attached to first substrate 82 by introducing a layer of adhesive 150 over third dielectric 142 and electrical element 130. FIG. 15 illustrates the composite structure. A suitable material for adhesive 150 includes epoxy.

Figure 16:
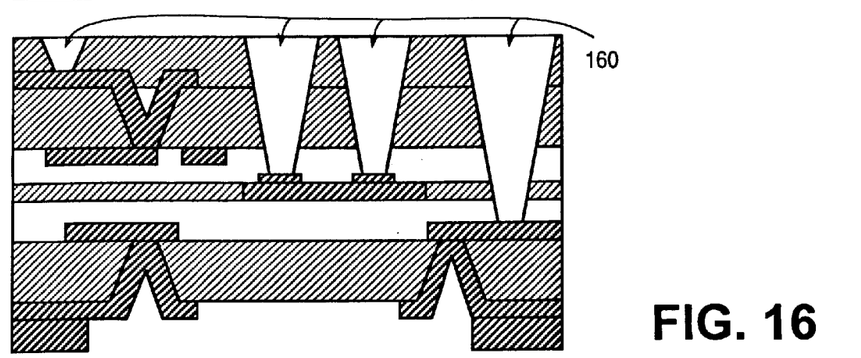
FIG. 16 schematically illustrates forming of vias in a attached substrate layers.
Figure 17:
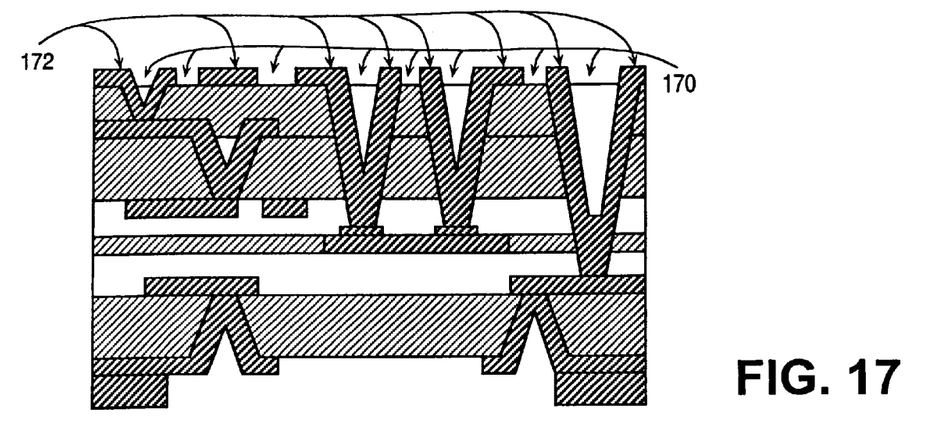
FIG. 17 schematically illustrates introduction of metal form vias.
Figure 18:
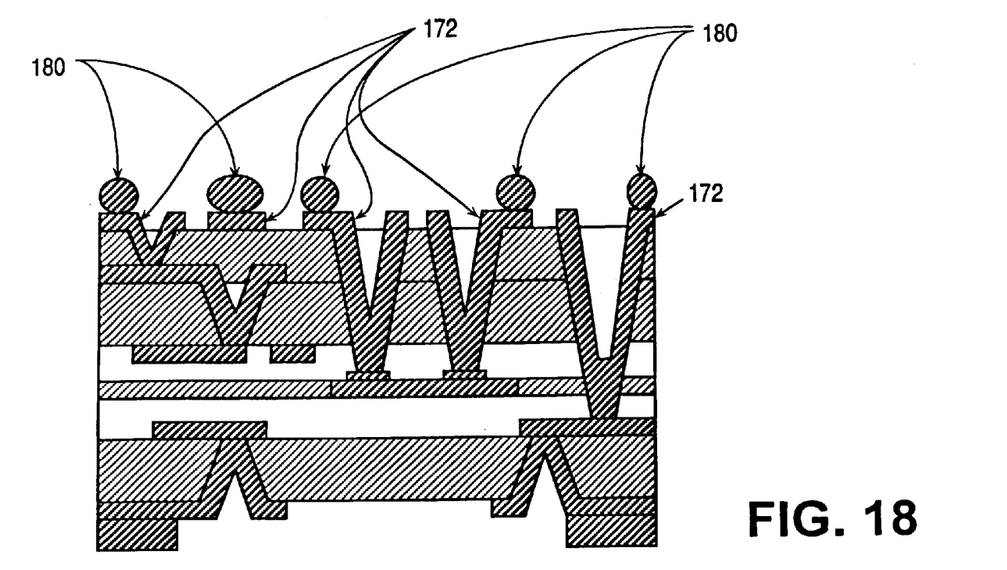
FIG. 18 schematically illustrates solder balls formed on bond pads on a substrate.

As illustrated in FIG. 16, via holes 160 are formed in the composite structure. Metal is applied and removed to form vias 170 and corresponding bond pads 172 illustrated in FIG. 17, with known plating and photolithographic processes. Vias 170 are connected to contact pads 134 of the electrical element 130. As illustrated in FIG. 18, solder balls 180 are formed on bond pads 172 with processes known in the art to complete the fabrication of an embodiment of an active interposer 14 according to the invention.

Figure 19:
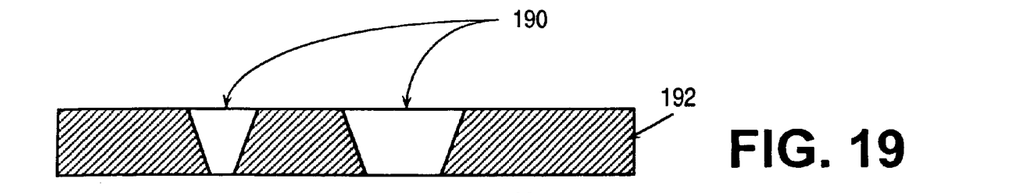
FIG. 19 schematically illustrates forming of vias on a first substrate.
Figure 20:
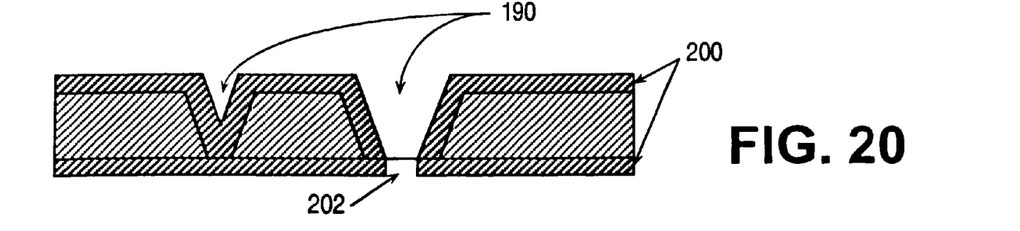
FIG. 20 schematically illustrates introducing a metal on surfaces of the first substrate.
Figure 21:
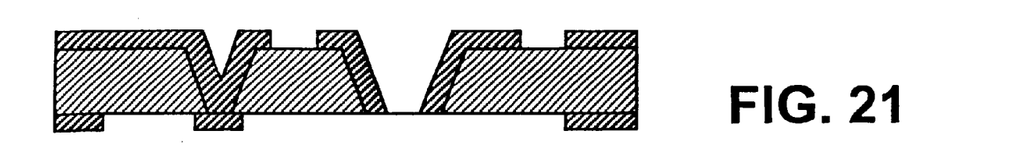
FIG. 21 schematically illustrates a pattern formed on first substrate.
Figure 22:
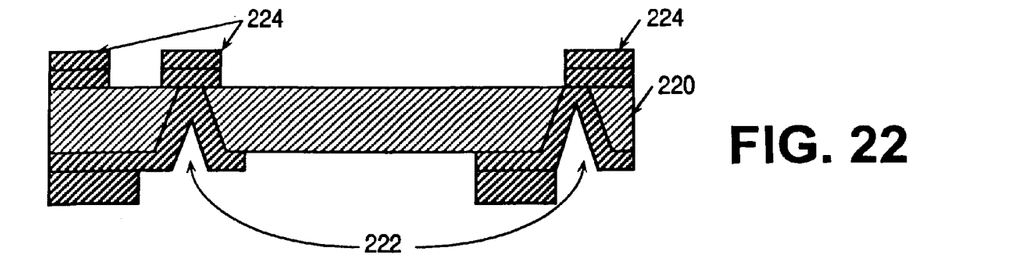
FIG. 22 schematically illustrates a second substrate with similar processes performed as was to the first substrate illustrated in FIGS. 19—21.

FIGS. 19–27 illustrate an alternate method for fabricating an active interposer 14' according to the invention. As illustrated in FIG. 19, via holes 190 are initially formed in a first substrate that is, for example, a polyimide material that is typically used in the fabrication of FLEX circuits. Metal material 200, such as copper, is introduced, for example by suitable introduction methods including deposition or plating, onto first substrate 192 and into via holes 190 as illustrated in FIG. 20. Metal material 200 may be plated in a manner to provide through hole 202 in one of via holes 190. The metal may be etched into a pattern as illustrated in FIG. 21. As illustrated in FIG. 22, a second substrate 220, that is, for example, a polyimide material that is typically used in the fabrication of FLEX circuits, is drilled, plated and etched to create vias 222 and solder pads 224.

Figure 23:
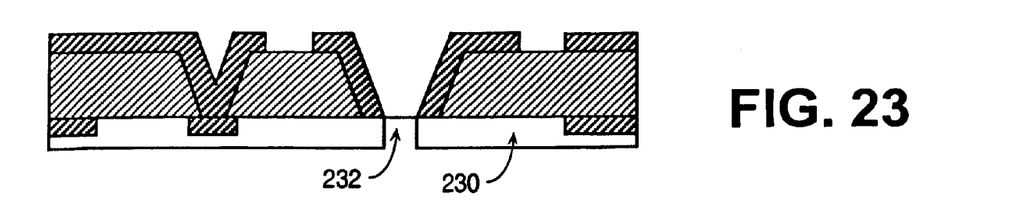
FIG. 23 schematically illustrates an adhesive attached to the first substrate and forming of a hole.
Figure 24:
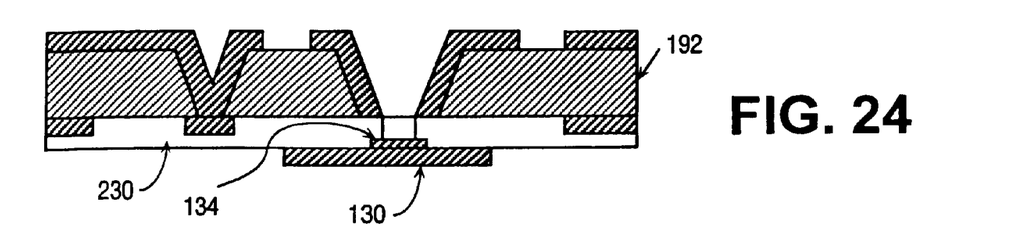
FIG. 24 schematically illustrates a third substrate attached to adhesive to surround an electrical element attached to the first substrate.
Figure 25:
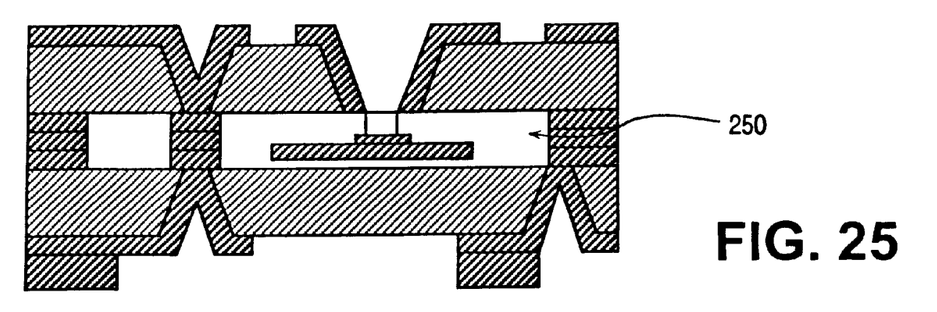
FIG. 25 schematically illustrates a first substrate attached to a second substrate with adhesive.
Figure 26:
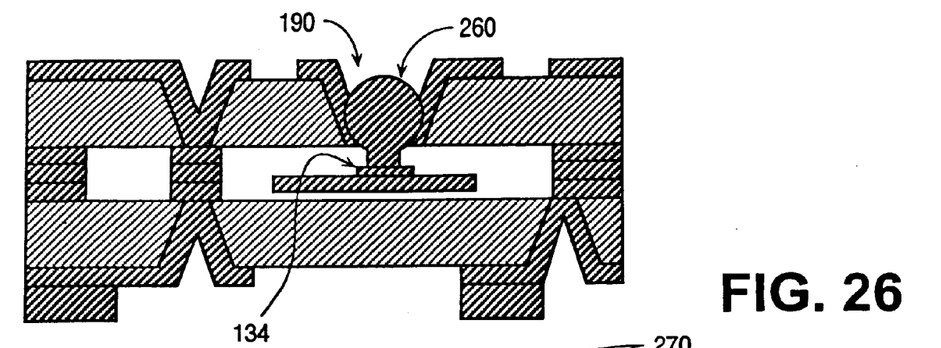
FIG. 26 schematically illustrates a conductive adhesive introduced to a via.
Figure 27:
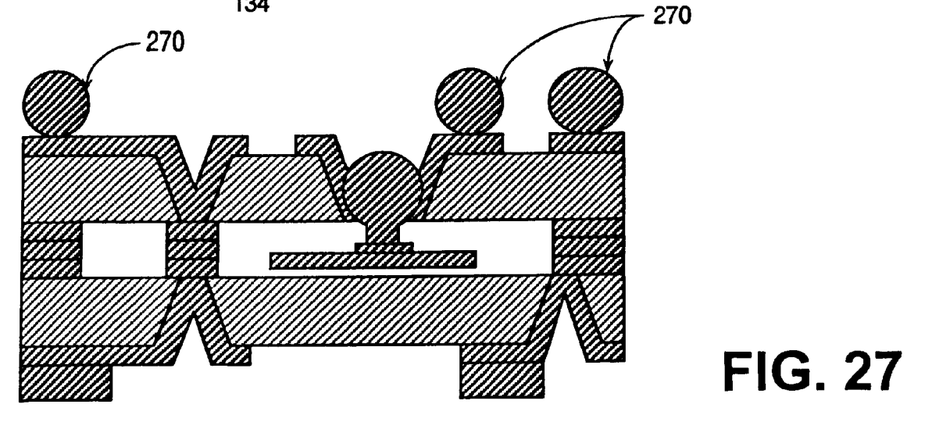
FIG. 27 schematically illustrates solder balls formed on bond pads on a substrate.

Electrical element 130 can be attached to first substrate 192 by a layer of adhesive 230 as illustrated in FIGS. 23 and 24. Hole 232 is formed in the adhesive 230 to expose contact pad 134 of electrical element 130. The second substrate 220 is attached to the first substrate 192 with another layer of adhesive 250, as illustrated in FIG. 25. As illustrated in FIG. 26, conductive adhesive 260 is placed in via hole 190 to interconnect contact pad 134 of electrical element 130 with the via. Solder balls 270 are then formed onto the solder pads as illustrated in FIG. 27 with processes known in the art.

While certain exemplary embodiments have been described and illustrated in the accompanying drawings, it is to be understood that such embodiments are merely illustrative of and not restrictive on the broad invention, and that this invention not be limited to the specific constructions and arrangements illustrated and described, since various other modifications may occur to those ordinarily skilled in the art.

What is claimed is:

1. A method comprising:

forming a first via hole in a first substrate;

introducing metal on a first surface and a second surface of the first substrate, the metal introduced on the first surface of the first substrate is layered over the first via hole and comes in contact with the metal introduced on the second surface of the first substrate;

patterning signal lines in the introduced metal on the first surface and the second surface of the first substrate, wherein the patterned signal lines in the introduced metal on the first surface and the second surface of the first substrate forms a first metal pattern;

attaching a first dielectric to the first surface of the first substrate, wherein the dielectric is in contact with the first metal pattern and the first surface of the first substrate;

electronically connecting a portion of the signal lines of the first substrate and the dielectric;

attaching an electrical element to the second surface of the first substrate, wherein the electrical element is one of a passive and an active electrical element;

removing a portion of the electrical element to reduce the thickness of the electrical element;

attaching a second dielectric to the second surface of the first substrate, wherein the second dielectric is in contact with the active electrical element and the second surface of the first substrate and the second dielectric surrounds the electrical element and has a thickness equivalent to the remaining portion of the electrical element.

2. The method of claim 1, further comprising forming a second via hole in a second substrate;

introducing metal on a first surface and a second surface of the second substrate, the metal introduced on the first surface of the second substrate is layered over the second via hole and comes in contact with the metal introduced on the second surface of the second substrate;

patterning signal lines in the introduced metal on the first surface and the second surface of the second substrate, wherein the patterned signal lines in the introduced metal on the first surface and the second surface of the second substrate forms a second metal pattern;

attaching a third dielectric to the first surface of the second substrate, wherein the third dielectric is in contact with the second metal pattern and the first surface of the second substrate; and attaching the second substrate to the first substrate, wherein the dielectric is in contact with the metal pattern and the first surface of the first substrate.

3. The method of claim 2, wherein the first via hole and the second via hole are layered with a conductive material forming a first new via hole and a second new via hole, wherein the depth of the first new via hole is less than the depth of the first via hole and the depth of the second new via hole is less than the depth of the second via hole.

4. The method of claim 2, wherein the electrical element is attached to the first substrate with a first layer of adhesive.

5. The method of claim 4, further comprising attaching the second substrate to the first substrate with a second layer of adhesive, wherein the active electrical element is covered by the adhesive.

6. The method of claim 4, wherein the first substrate, the second substrate and the dielectric are a polymide.

7. The method of claim 5, further comprising forming a plurality of via holes in the first substrate and the second substrate, wherein at least one of the plurality of via holes forms an opening from the first substrate to the second substrate;

introducing conductive material over the plurality of via holes;

wherein the introducing conductive material over the plurality of via holes forms a plurality of new holes and forms a plurality of bond pads, wherein the depth of the plurality of new via holes are less than the depth of the plurality of via holes.

8. The method of claim 7, further comprising attaching the plurality of new via holes with a contact pad of the electrical element.

9. The method of claims 8, further comprising forming solder balls on the plurality of bond pads.

10. The method of claim 1, wherein the forming of via holes is accomplished by one of mechanical drilling, laser drilling and etching.

11. A method comprising:

forming a first via hole and a second via hole in a first substrate;

introducing conductive material over a first surface and a second surface of the first substrate; wherein introducing conductive material over the first surface and the second surface of the first substrate fills the first via hole to form a new via hole and a portion of the conductive material introduced over the second surface of the first substrate is removed from the second via hole forming a via through hole, wherein the depth of the new via hole is less than the depth of the first via hole and the width of the, new via through hole is less than the width of the second via hole and the conductive material comes in contact with the metal introduced on the second surface of the first substrate through the new via hole;

forming a first circuit pattern on the introduced conductive material on the first surface and the second surface of the first substrate;

forming solder pads on the first circuit pattern;

attaching a dielectric to the first substrate;

attaching an active electrical element to the first substrate with a first layer of adhesive;

forming a hole in the first layer of adhesive to expose a contact pad of the electrical element;

forming a via hole in a second substrate;

introducing conductive material over a first surface and a second surface of the second substrate;

forming a second circuit pattern on the first surface and the second surface of the second substrate; and attaching the first substrate with the second substrate, wherein the active electrical element is disposed between the first substrate and the second substrate and electrically coupled through the new via through hole.

12. The method of claim 11 further comprising forming solder pads on the second circuit pattern.

13. The method of claim 12, wherein the first substrate is attached to the second substrate with a second layer of adhesive.

14. The method of claim 12 wherein a conductive adhesive is attached to a via hole and a contact pad of the electrical element.

15. The method of claim 12, wherein solder balls are attached to solder pads of the first substrate.

16. The method of claim 13, wherein metallic solder ink is attached to a via hole and a contact pad of the electrical element.

17. A method comprising:

forming a first via hole in a first substrate;

introducing metal on a first surface and a second surface of the first substrate;

patterning signal lines on the introduced metal on a first surface and a second surface of the first substrate;

attaching a dielectric to the first surface of the first substrate, wherein the dielectric is in contact with the signal lines and the first surface of the first substrate;

electronically connecting a portion of the signal lines of the first substrate and the dielectric;

attaching an active electrical element to the first surface of the first substrate with a first layer of adhesive;

removing a portion of the active electrical element to reduce the thickness of the active electrical element;

forming a second via hole in a second substrate;

introducing metal on a first surface and a second surface of the second substrate;

patterning signal lines on the introduced metal on the first surface and the second surface of the second substrate; and attaching the second substrate to the first substrate with a second layer of adhesive, wherein the active electrical element is covered by the adhesive.

18. The method of claim 17, wherein the first via hole and the second via hole are layered with a conductive material forming a first new via hole and a second new via hole, wherein the depth of the first new via hole is less than the depth of the first via hole and the depth of the second new via hole is less than the depth of the second via hole.

19. The method of claim 18, wherein the first substrate, the second substrate and the dielectric are a polyimide.

20. The method of claim 19, further comprising forming a plurality of via holes in the first substrate and the second substrate;

introducing conductive material over the plurality of via holes;

wherein the introducing conductive material over the plurality of via holes forms a plurality of new via holes and forms a plurality of bond pads, wherein the depths of the plurality of new via holes are less than the depths of the plurality of via holes.

21. The method of claim 20, further comprising attaching the plurality of new via holes with a contact pad of the electrical element.

22. The method of claim 21, further comprising forming solder balls on the plurality of bond pads.

23. The method of claim 17, wherein the electrical element is one of a passive device and an active device.

* * * * *